United States Patent
Mishima

[19]

[11] Patent Number: 5,943,135
[45] Date of Patent: *Aug. 24, 1999

[54] POSITION DETECTING METHOD AND POSITION DETECTING SYSTEM USING THE SAME

[75] Inventor: Kazuhiko Mishima, Utsunomiya, Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/727,230

[22] Filed: Oct. 8, 1996

[30] Foreign Application Priority Data

Jul. 17, 1996 [JP] Japan ................................. 8-207856
Oct. 13, 1996 [JP] Japan ................................. 7-292223

[51] Int. Cl.$^6$ ......................................................... G01N 11/00
[52] U.S. Cl. ............................. 356/401; 356/400; 250/548
[58] Field of Search ........................................ 356/399, 400, 356/401; 250/548

[56] References Cited

U.S. PATENT DOCUMENTS

5,686,996  11/1997  Fidler et al. ............................ 356/399

Primary Examiner—Robert H. Kim
Attorney, Agent, or Firm—Fitzpatrick, Cella, Harper & Scinto

[57] ABSTRACT

A position detecting method includes illuminating a mark having a step, by use of an illuminating system, detecting an image of the mark, by use of a position detecting optical system, calculating an evaluation value representing symmetry of the detected mark image, and adjusting a position of an effective light source of the illuminating system with respect to an optical axis of the position detecting optical system, on the basis of the evaluation value.

13 Claims, 7 Drawing Sheets

FIG. 9

POSITION DETECTING METHOD AND POSITION DETECTING SYSTEM USING THE SAME

FIELD OF THE INVENTION AND RELATED ART

This invention relates to a position detecting method and a position detecting system using the same. More particularly, the invention is concerned with a position detecting method and a position detecting system usable in a projection exposure apparatus, for example, for projecting a pattern of a reticle onto a wafer in the manufacture of semiconductor ICs or LSIs, for detecting positional information of an object such as the reticle or wafer very precisely through observation of an image of the object and for positioning the object on the basis of the detected positional information.

Semiconductor device manufacture technology has advanced considerably, and fine processing technology has also advanced significantly. Particularly, optical processing technology which occupies a major portion of that technology and which uses a projection exposure apparatus for projecting a pattern of a reticle onto a wafer, has advanced into a submicron region after development of 1 MDRAM.

As the measures for improving the resolving power for a projected pattern image, having been adopted in projection exposure apparatuses, there are a method in which the numerical aperture of a projection optical system is enlarged while retaining the wavelength of exposure light fixed, and a method in which the exposure wavelength is band-narrowed such as from g-line to i-line or to the emission wavelength of an excimer laser. Also, there is a recently attempted method in which a phase shift mask or a modified illumination process is used to extend the limitation of optical processing through optical exposure.

On the other hand, with increases in resolving power, it is required for a projection exposure apparatus to provide enhanced precision with respect to the alignment process for relatively aligning a reticle and a wafer with each other. A projection exposure apparatus for the manufacture of semiconductor devices should thus function as an exposure apparatus and also as a position detecting system.

Figure 3:
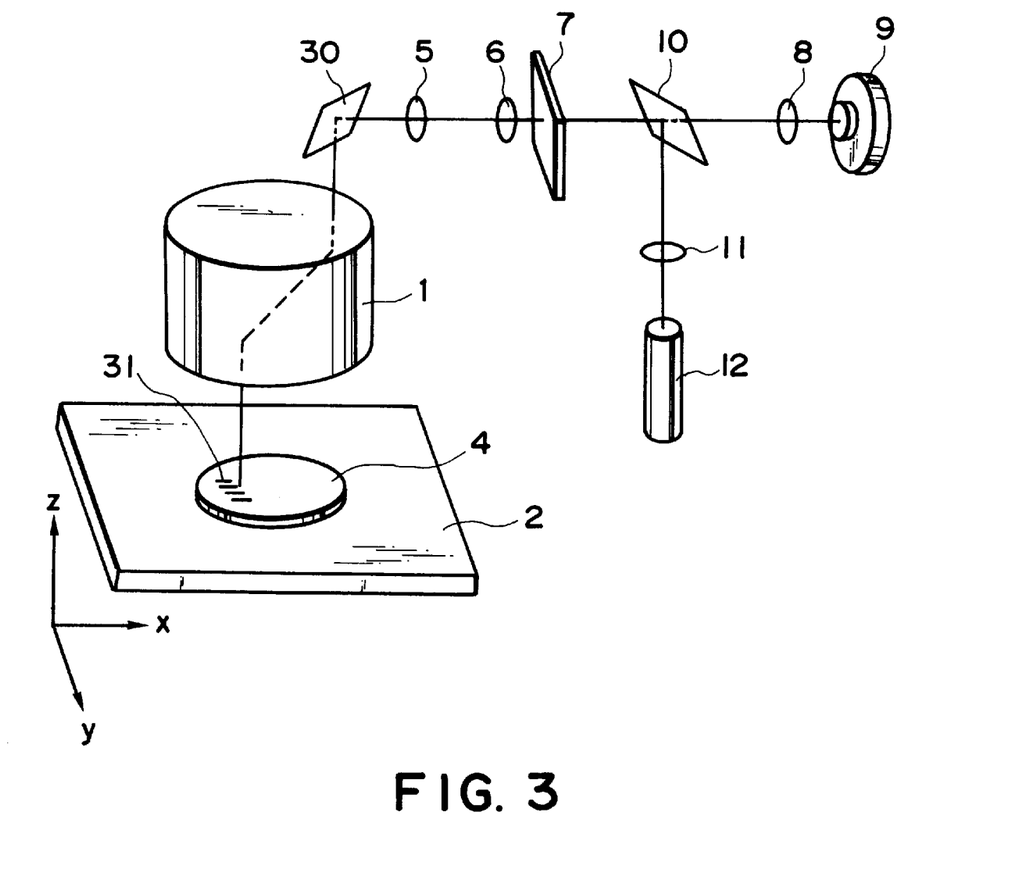
FIG. 3 is a schematic view of a known example of a position detecting system.

FIG. 3 is a schematic view of the structure of a position detecting system for alignment process, in a projection exposure apparatus for manufacture of semiconductor devices. X and Y axes are taken along the surface of a wafer 4, as illustrated. Since the function of a position detecting system of a projection exposure apparatus is essentially the same with respect to the X direction and to the Y direction, description will be made here only to the measurement with respect to the Y direction. In the following, position detecting optical system (position detecting system) refers to the whole optical arrangement from a light source to the detection.

Light emitted by a light source (not shown) such as a He—Ne laser, for example, goes through a fiber 12 to an illumination optical system 11. The light is then received by a polarization beam splitter 10, by which S-polarized component is reflected. It is then transformed by a quarter wave plate 7 into circularly polarized light. After this, the light goes via imaging optical systems 6 and 5, a mirror 30 and a projection exposure optical system 1, and it is projected on to a wafer 4 to perform Koehler illumination of a mark (alignment mark) 31 formed on the wafer 4. The wafer is placed on a stage 2 which is movable in X, Y and Z directions. Reflection light or scattered light from the mark 31 goes again via the projection exposure optical system 1, the mirror 30 and the imaging optical systems 5 and 6. Then, it passes the quarter wave plate 7 whereby it is transformed into P-polarized light which is a component contained in the sheet of the drawing. Because it is converted into P-polarized light, the light then passes the polarization beam splitter 10. Thus, by means of an imaging lens 8, an image of the mark 31 is formed on a photoelectric converting element 9 comprising a CCD camera, for example. A signal corresponding to the mark image as detected by the photoelectric converting element 9 is image-processed, and the position of the mark 31 is detected precisely. On the basis of the result of detection, the stage 2 is moved to perform alignment of the wafer 4.

The position detecting system shown in FIG. 3 involves some problems causing deterioration of position detecting precision.

A first factor relates to detection wavelength. Such a position detecting system has an alignment light source which uses non-exposure (non-sensitizing) light for preventing exposure (printing) of the mark image during the detection process. Since the projection exposure optical system 1 is best aberration-corrected with respect to the exposure wavelength, there occurs aberration when used with the non-exposure wavelength. This may be combined with an effect of any manufacturing error, to produce a measurement error in the position detecting process.

A second factor relates to Koehler illumination. In the Koehler illumination method, practically it is difficult to use $\sigma=0$ for the illumination because of the problem of light quantity or cut-off of spatial frequency in imaging. Generally, a light source having a light emitting face of infinite size is used. For example, light from a laser light source is guided by a fiber to an illumination system or a lamp itself is used as the light source.

Since $\sigma$ is not equal to zero, upon the wafer surface (the surface on which position detection is to be performed) there exists illumination light having a certain angle with respect to the optical axis. Although Koehler illumination is a process for uniformly illuminating a detection surface, it does not assure up to the uniformness of effective light source which is a distribution on a pupil plane of the detection optical system. Thus, when the light intensity distribution on the effective light emission face is not symmetrical with respect to the mark measurement direction, that is, if the incidence angle distribution of illumination light to the detection surface is asymmetric, the light intensity distribution of the mark image being observed differs from that when illuminated symmetrically. It, therefore causes a measurement error.

Figure 4A:
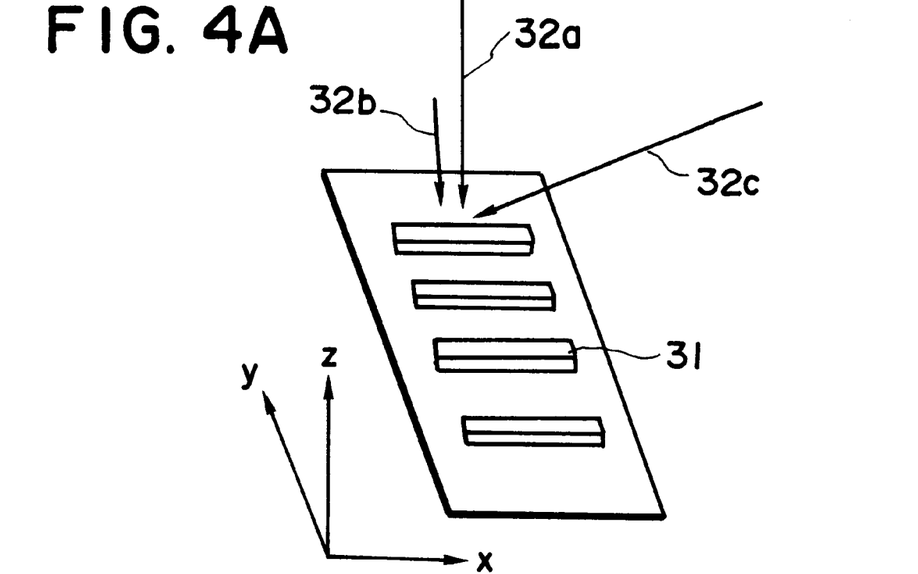
FIGS 4A–4C schematic views for explaining the relation among an alignment mark, illumination lights and a signal.
Figure 4B:
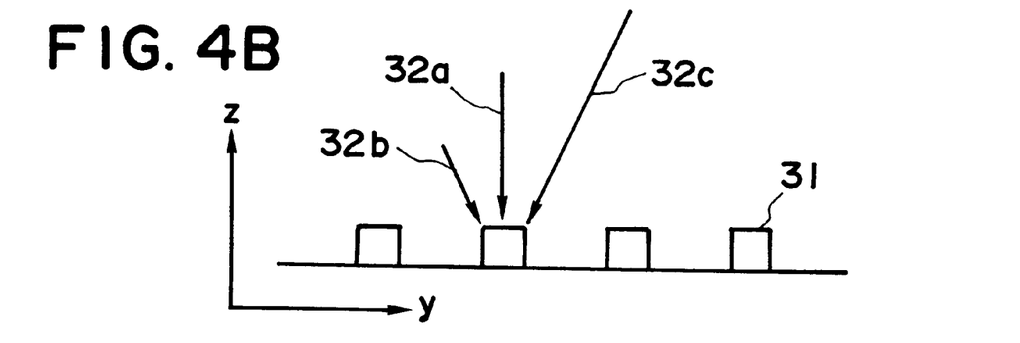
Figure 4C:
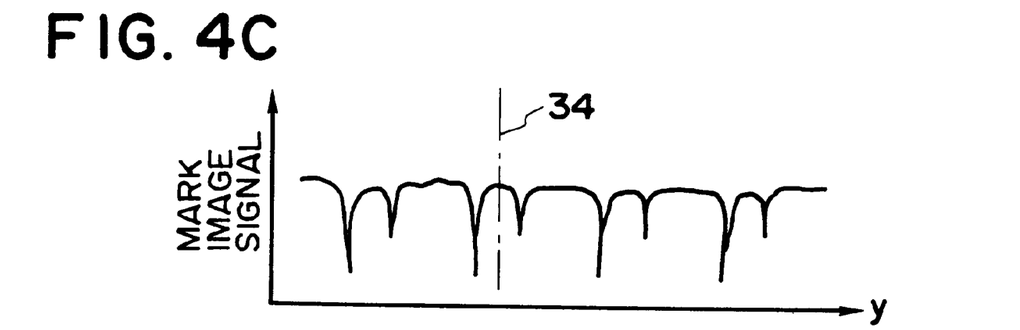

FIG. 4A is a perspective view of a Y-direction measurement mark 31, and FIG. 4B is a sectional view of the mark as viewed in the X direction. FIG. 4C shows a signal waveform observed.

Since the light intensity distribution on the effective light emission surface is equivalent to the emission light intensity distribution of the light source, upon the detection surface there is produced an intensity distribution of incidence angle which depends on the intensity of that light emission region. In FIG. 4A, reference numeral 32a denotes light which is projected on the mark 31 perpendicularly thereto, and reference numerals 32b and 32c denote lights projected with the same angle with respect to the perpendicular direction but in different directions, respectively. The mark 31 having a step structure is illuminated with these lights, to perform position detection. If the illumination light intensity of the light 32b projected in an oblique direction, as illustrated, is lower than the illumination light intensity of the light 32c projected in another oblique direction, for detection of the mark 31, there arises a difference in intensity of scattered light at the mark edge portion. This may cause the failure of correct position detection. If for simplicity, it is assumed that the sectional shape of the mark 31 is completely symmetric, then there is no necessity of taking into account the difference in interference condition to the scattered light from the mark edge. However, even in such an idealistic case, the scattering action of light at the mark edge varies if the intensity of the light 32c is higher than that of the light 32b and, as a result, the imagewise signal of the mark becomes asymmetric as illustrated in FIG. 4C. Namely, irrespective of that the mark itself is symmetric, if the illumination condition is asymmetric the waveform of the detected imagewise signal is distorted, causing a difficulty in correct mark position detection. As a matter of course, if the lights 32b and 32c have the same intensity (symmetrical intensity), the resultant waveform is fully symmetrical.

Asymmetry of signal may result from a difference in step structure of the mark or a difference in semiconductor manufacturing process such as in a resist, for example. Also, the scattering characteristic of the edge may be proportional to the intensity of incident light or it may be in inverse proportion to that intensity. It varies and makes the occurrence of signal asymmetry comlicated. However, what is important for the apparatus itself is to remove a mark measurement error due to asymmetry of incidence angle intensity of illumination light with respect to the measurement direction.

SUMMARY OF THE INVENTION

As a solution for that problem, a filter such as a diffusion plate, for example, may be disposed at a pupil plane or an imaging plane of a position detecting system, to thereby uniform the light intensity distribution or the angle distribution. If a diffusion plate is used, however, there occurs a decrease in light quantity upon the object surface in inverse proportion to uniformization of light intensity. This may cause a difficulty of performing alignment mark detection, depending on the process of semiconductor device manufacture.

The present invention takes a particular note to the points described above and to some facts found by the inventors through experiments, and provides a position detecting method and/or a position detecting system using the same suitable for the manufacture of high density semiconductor devices, for example, which method optimizes the illumination condition for a position detecting optical system so as to remove aberration of the position detecting optical system, including a projection exposure optical system. Based on this, the present invention assures enhanced position detecting precision.

As described, one-dimensional or two-dimensional light intensity distribution upon Fourier transformation plane of the image plane corresponding to the pupil plane of the position detecting optical system of the position detecting system, corresponds to the angular characteristic of light with which Koehler illuminates the mark on the object to be detected. Also, the imagewise signal of the mark to be detected is influenced by that angular characteristic. If the position detecting optical system including a projection exposure optical system shows no aberration with respect to detection light, in order that the imagewise signal to be detected is symmetric, the angular characteristic of the illumination light may be made symmetrical with respect to the center of the mark. Namely, it is necessary that the light intensity distribution upon the pupil plane is symmetric with respect to the optical axis. Here, the symmetry required to the pupil plane intensity is the one with respect to the mark measurement direction.

Further, on the basis of experiments made by the inventors, it has been confirmed that the imagewise signal of the mark detected varies particularly in dependence upon the gravity center position of the light intensity distribution. Also, it has been confirmed that, when the position detecting optical system itself including a projection exposure optical system has an aberration, the asymmetry of the mark imagewise signal due to the influence of it may be canceled through adjustment of the optical gravity center of the pupil plane, and that there is a mark having such structure that the signal responds sharply to a change in this optical gravity center. The present invention takes particular note to these points, and provides a position detecting optical system which comprises an illumination system having an adjustable optical gravity center. On the basis of observation of a particular imagewise signal, the illumination condition is optimized by which enhancement of position detecting precision is assured.

More specifically, in accordance with an aspect of the present invention, there is provided a position detecting method, comprising the steps of: illuminating a mark having a step, by use of illuminating means; detecting an image of the mark, by use of a position detecting optical system; calculating an evaluation value representing symmetry of the detected mark image; and adjusting a position of an effective light source of the illuminating means with respect to an optical axis of the position detecting optical system, on the basis of the evaluation value.

The calculating step may include calculating an evaluation value on the basis of a difference in light intensity between edges of the mark image on the opposite sides of a center of the mark.

When a detection wavelength used with the position detecting optical system is $\lambda$, the step of the mark may have a magnitude corresponding to $\lambda/8$.

In accordance with another aspect of the present invention, there is provided a position detecting method, comprising the steps of: illuminating a mark having a step, by use of illuminating means; detecting an image of the mark, by use of a position detecting optical system; calculating an evaluation value representing symmetry of the detected mark image; rotating the mark by 180 deg. and then executing the illuminating step, the detecting step and the calculating step again, whereby another evaluation value is obtained; and adjusting a position of an effective light source of the illuminating means with respect to an optical axis of the position detecting optical system, on the basis of the two evaluation values.

The calculating step may include calculating an evaluation value on the basis of a difference in light intensity between edges of the mark image on the opposite sides of a center of the mark.

The adjusting step may include detecting a difference between the two evaluation values and continuing adjustment of the position of the effective light source of the illuminating means with respect to the optical axis of the position detecting optical system until the difference comes to a predetermined value.

When a detection wavelength used with the position detecting optical system is $\lambda$, the step of the mark may have a magnitude corresponding to $\lambda/8$.

In accordance with a further aspect of the present invention, there is provided a position detecting system, comprising: illuminating means for illuminating a mark having a step; a position detecting optical system for detecting an image of the mark; and control means for calculating an evaluation value representing symmetry of the detected mark image and for adjusting a position of an effective light source of the illuminating means with respect to an optical axis of the position detecting optical system, on the basis of the evaluation value.

The control means may calculate an evaluation value on the basis of a difference in light intensity between edges of the mark image on the opposite sides of a center of the mark.

When a detection wavelength used with the position detecting optical system is $\lambda$, the step of the mark may have a magnitude corresponding to $\lambda/8$.

In accordance with yet a further aspect of the present invention, there is provided a position detecting system, comprising: illuminating means for illuminating a mark having a step; a position detecting optical system for detecting an image of the mark; and control means for calculating an evaluation value representing symmetry of the detected mark image in a first state of the mark and in a second state of the mark, rotated by 180 deg. from the first state, whereby two evaluation values are provided, the control means further being serviceable to adjust a position of an effective light source of the illuminating means with respect to an optical axis of the position detecting optical system, on the basis of the two evaluation values.

The control means may calculate an evaluation value on the basis of a difference in light intensity between the edges of the mark image on the opposite sides of a center of the mark.

The control means may detect a difference between the two evaluation values and continues adjustment of the position of the effective light source of the illuminating means with respect to the optical axis of the position detecting optical system until the difference comes to a predetermined value.

When a detection wavelength used with the position detecting optical system is $\lambda$, the step of the mark may have a magnitude corresponding to $\lambda/8$.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
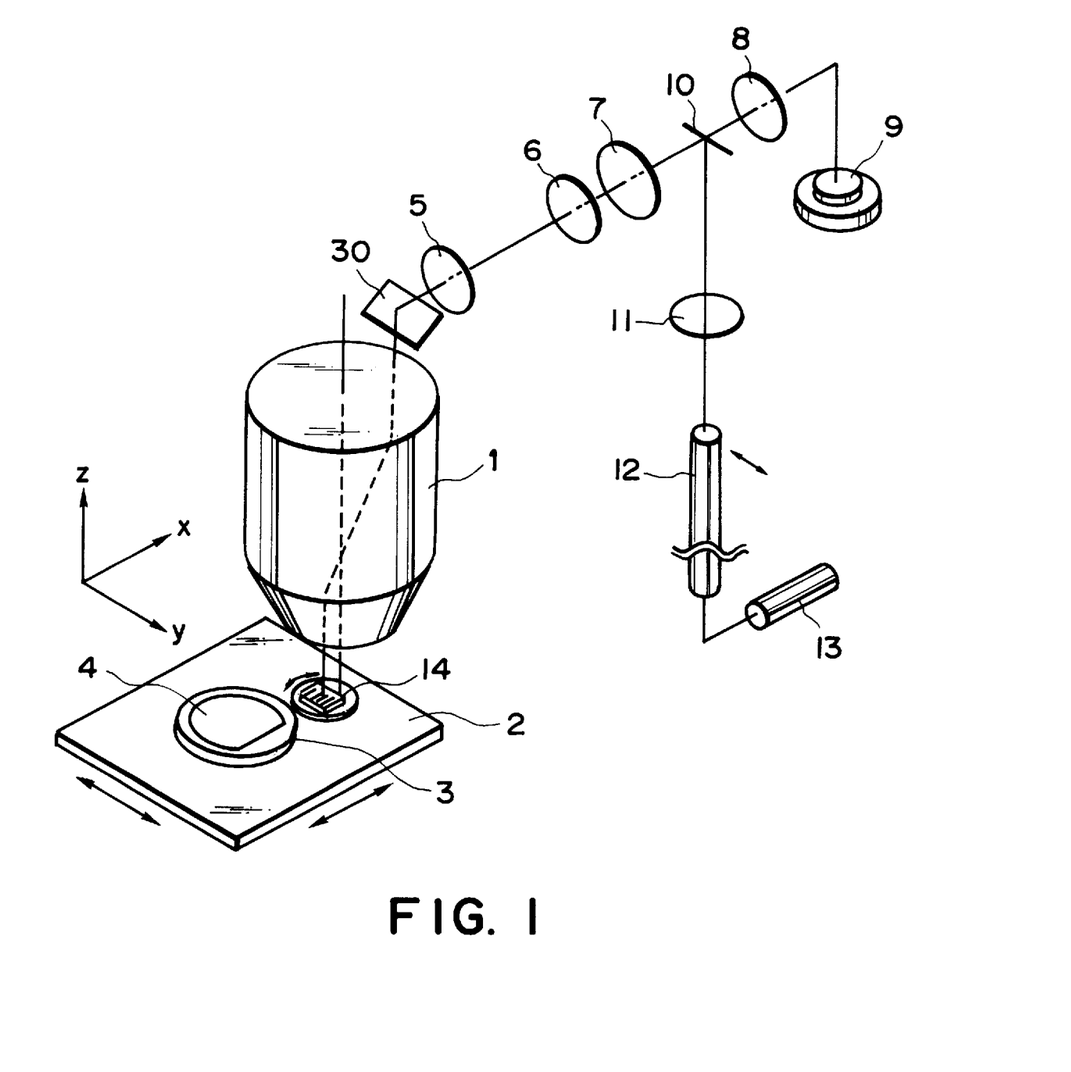
FIG. 1 is a schematic view of a position detecting system according to a first embodiment of the present invention.

FIG. 1 shows a projection exposure apparatus for manufacture of semiconductor devices, according to a first embodiment of the present invention. Reference numerals the same as those of FIG. 3 are assigned to corresponding elements. X and Y axes are taken on the plane of the wafer 4 surface. Since the position detecting optical system of the projection exposure apparatus of this embodiment has essentially the same measurement function with respect to the X and Y directions, the following description will be made on the Y-direction measurement only.

In FIG. 1, light source 13 comprises a He—Ne laser or any other light source which provides non-exposure light. The light from the light source 13 goes through a fiber 12 and enters an illumination optical system 11. The light is received by a polarization beam splitter 10 by which S-polarized light component perpendicular to the sheet of the drawing is reflected. The reflected light passes a quarter wave plate 7 by which it is transformed into circularly polarized light. After this, the light goes via imaging optical systems 6 and 5, a mirror 30 and a projection exposure optical system 1, and it illuminates a mark or a reference mark 14 for adjustment, which is formed on a wafer 4. The wafer 4 is placed on a stage 2 which is movable in X, Y and Z directions. Reflection light or scattered light from the mark goes back through or via the projection exposure optical system 1, the mirror 30 and the imaging optical systems 5 and 6, and it passes the quarter wave plate 7 by which it is now transformed into P-polarized light which is a component contained in the plane of the sheet of the drawing. Because it is converted into P-polarized light, the light then goes through the polarization beam splitter 10 and, by means of an imaging lens 8, an image of the mark is formed on a photoelectric converting element 9 which comprises a CCD camera, for example. The signal as detected by the photoelectric converting element 9 is image processed by which the position of the mark is detected. Then, in accordance with the detected value, the stage 2 is moved to adjust the position of the wafer 4.

Figure 9:
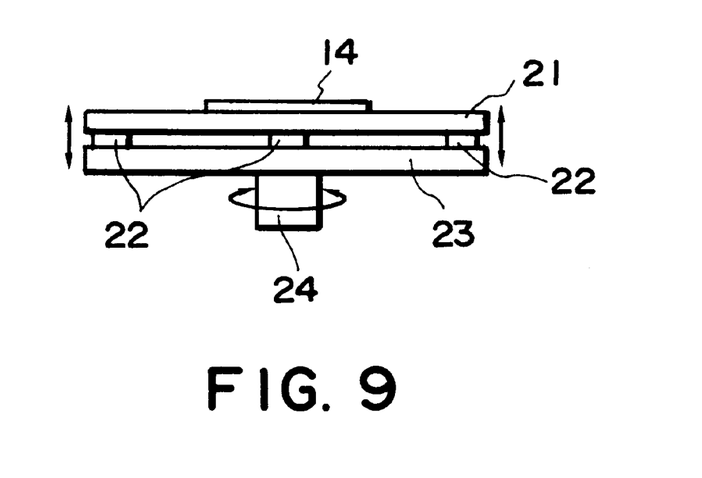
FIG. 9 is a schematic view for explaining a reference mark for adjustment, to be provided on a stage.

In accordance with the present invention, the reference mark 14 for adjustment is provided on the stage 2. This adjustment reference mark 14 is formed on a mechanism with a structure as illustrated in FIG. 9. More specifically, the reference mark 14 is provided on a second substrate 21 which is mounted on a first substrate 23 with the intervention of an electrostrictive device 22 such as a piezoelectric device, for example, for adjustment in the Z-axis direction thereof. The first substrate is held by a rotational shaft 24. With this structure, focus adjustment of the reference mark can be done by controlling an applied voltage to the piezoelectric device 22. Also, the reference mark can be rotationally moved by a desired angle. Particularly, the reference marks can be rotated by 180 deg., such that, on the basis of comparison between observations before and after rotation, the effect of any asymmetry of the structure itself of the reference mark 24 can be removed. In this embodiment, a special mark such as the reference mark 14 is used, by which measurement can be done easily and independently of the wafer and, additionally, stable measurement reference is provided.

While the reference mark 14 for adjustment is provided on the stage 2 in this embodiment, similar function may be achieved by using a wafer having a similar mark or a mark with similar function.

Figure 6A:
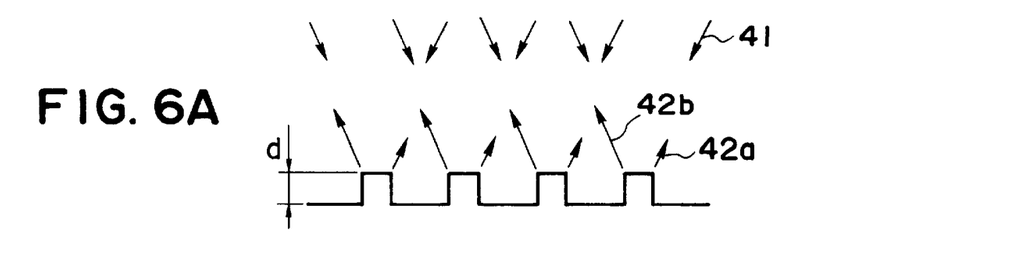
FIGS. 6A and 6B are schematic views for explaining a detection signal in a case where a position detecting optical system has an aberration.
Figure 6B:
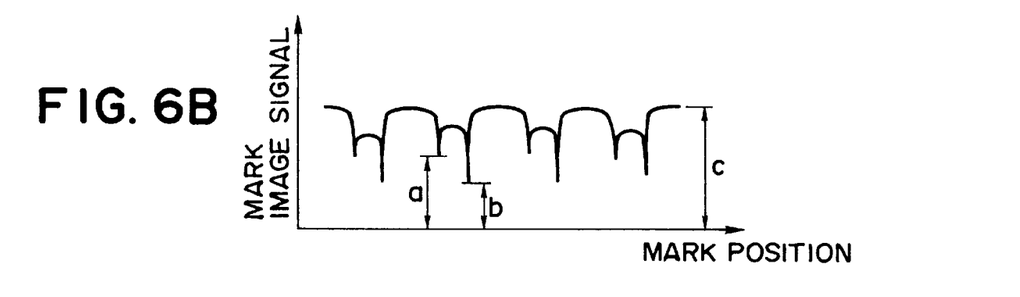

Here, a case where the optical gravity center of the pupil plane of the position detecting optical system is symmetric with respect to the optical axis, within the plane containing the measurement direction, but the position detecting optical system including the projection exposure optical system has an eccentric comma aberration with respect to the detection wavelength, is now considered. FIGS. 6A and 6B are schematic views for explaining a detection signal obtainable in this embodiment. FIG. 6A shows a mark which has a step-like shape in the section along the measurement direction, as well as illumination light 4 and scattered lights 42a and 42b, having considered the eccentric comma aberration. FIG. 6B shows an imagewise signal of the reference mark in the state of FIG. 6A. Detection light from edges of the mark has a waveform which is asymmetric with respect to the center of the mark. Here, taking the intensity at one edge of the mark as a, the intensity at the other edge as b, and the intensity of the mark as a whole as c, an evaluation value E is calculated as follows:

$$E=(a-b)/c \quad (1)$$

Figure 7A:
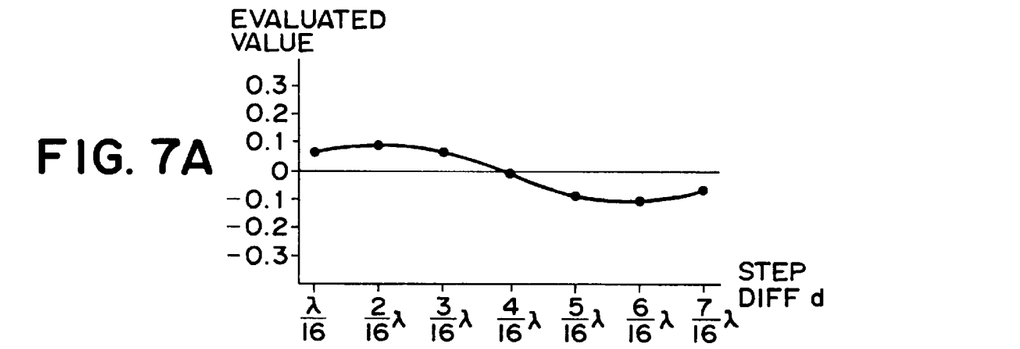
FIGS 7A and 7B are graphs for explaining the relation between the magnitude of the mark step and the evaluation value, varying with the state of adjustment of a position detecting optical system.
Figure 7B:
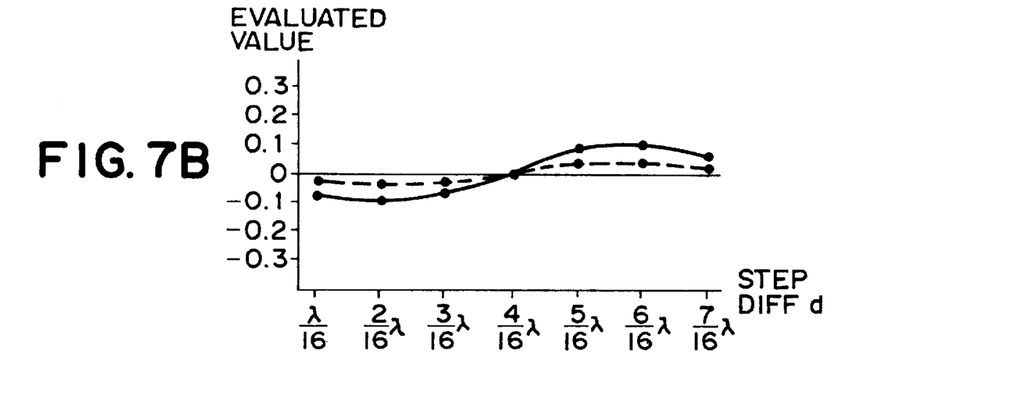

The evaluation value E may be considered as a parameter that represents waveform distortion. Under such definition, while changing the height d of the step (surface step) of the alignment mark having a rectangular step structure with silicone (Si), evaluation value E is measured. The results are shown in FIG. 7A or 7B. In the drawings, the axis of abscissa is taken for the step (height) d with the modulus being taken with the wavelength $\lambda$ of detection light of the He—Ne laser, and the axis of ordinate is taken for the evaluation value E. From investigations based on experiments and simulations, it has been confirmed that the evaluation value E varies like a periodic function, as illustrated in FIG. 7A.

On the other hand, FIG. 7B shows the evaluation value E for step heights, in a case where, as the position detecting optical system including the projection exposure optical system has no aberration, the end face (effective light source) of the fiber 12 shown in FIG. 1 is deviated (eccentric) with respect to the optical axis of the position detecting optical system. Solid curve illustrates the characteristic when the eccentricity of the optical gravity center of the effective light source is in the measurement direction and of a magnitude of 3% of the numerical aperture (N.A.) of the detecting system. Broken line illustrates the characteristic when the eccentricity is of a magnitude of 1.5%. The axis of abscissa and the axis of ordinate are taken similarly as FIG. 7A. It is seen that the evaluation value E varies with an amplitude, in accordance with the magnitude of eccentricity of the optical gravity center. That is, when the position detecting optical system does not have an aberration, by adjusting the optical gravity center of the effective light source to place it into alignment with the optical axis, it is possible to provide a detection optical system independently of the step height, i.e., a detection optical system with smaller offset (inter-process offset) dependent upon the mark structure in semiconductor device manufacturing processes of a large number.

Both of the characteristics shown in FIGS. 7A and 7B have an analogous sine wave form. Thus, if the position detecting optical system including the projection exposure optical system has an eccentric comma component, by adjusting the optical gravity center of the effective light source in a direction cancelling the waveform distortion of the imagewise signal of the mark due to eccentric comma, it is possible to obtain a position detecting optical system free from the influence of the step height, like an idealistic case. Also, it has been found from FIGS. 7A and 7B that using a mark having a step height about $\lambda/8$ or $3\lambda/8$ is effective to perform sensitive and efficient adjustment of the optical gravity center of the effective light source. For practical adjustment, forming a mark having rectangular steps by using a Si wafer is convenient in the point of ease in control of the step height d. However, similar advantageous effects are obtainable by forming a similar mark (that is, a mark having a rectangular step structure and showing, to detection light, similar interference phenomenon only at its edges) by using any other material. Since the evaluation value to the step height varies periodically as illustrated in FIG. 7A or 7B, a magnitude of step height equal to the product of $\frac{1}{8} \lambda$ multiplied by an odd number may be used, other than $\lambda/8$ or $3 \lambda/8$. It will be readily understood from the graphs that similar advantageous results are attainable in that occasion.

Figure 5:
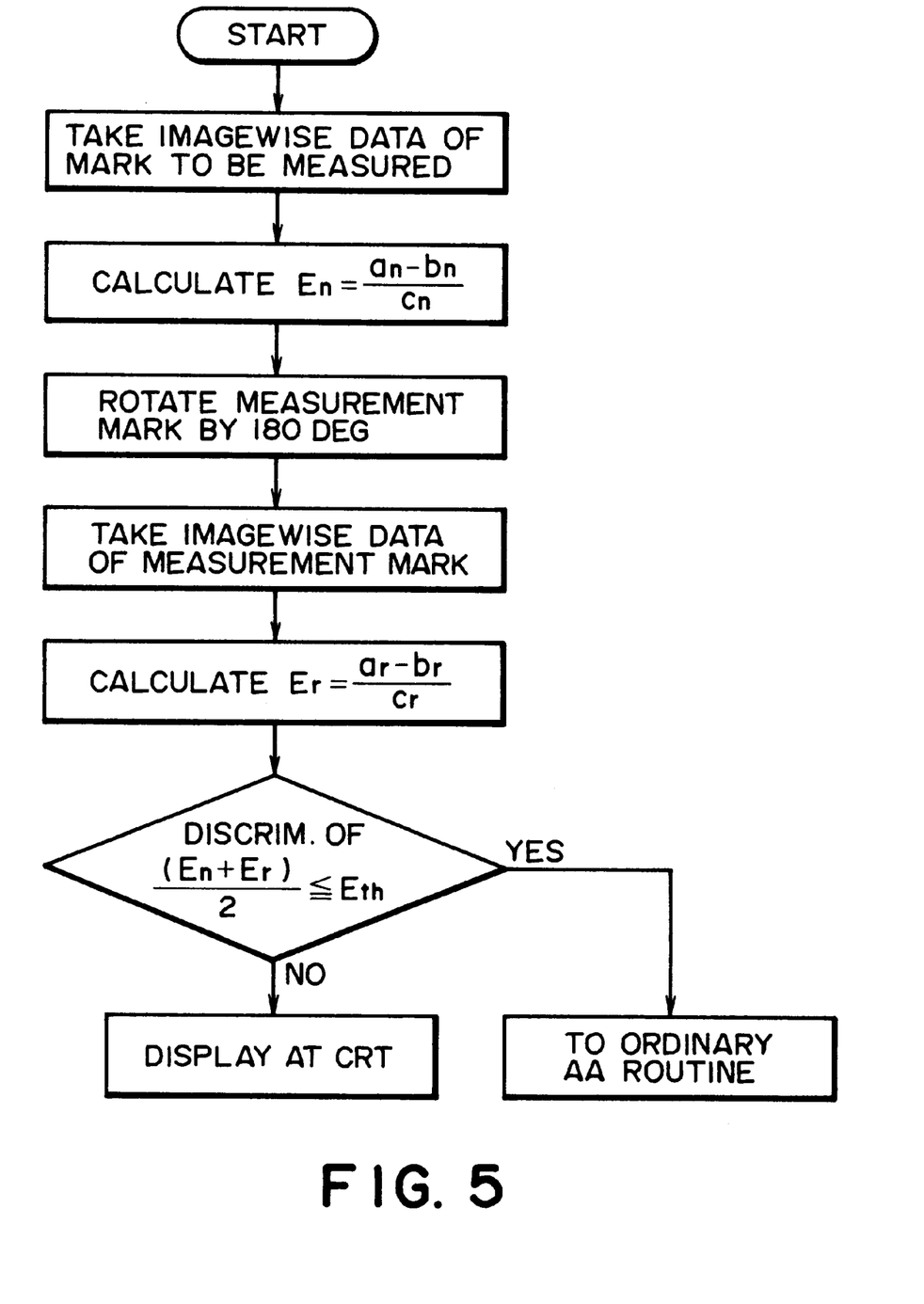
FIG. 5 is a flow chart for explaining optical gravity center optimizing procedure.

FIG. 5 is a flow chart for explaining practical adjustment procedure. While the adjustment may be performed by using a wafer having a step structure of a height of $\lambda/8$ or near to it as described hereinbefore, the following description will be made with respect to a case where the adjustment reference mark 14 of FIG. 1 is used.

First, the adjustment mark 14 as it is in its initial state with no rotation is moved to the focus position by means of the piezoelectric device 22, and imagewise data of the reference mark 14 is taken. Here, the measurement in this status will be represented with the addition of a subscript "n", and the heights (levels) of edge signal components of the produced imagewise data are denoted by $a_n$ and $b_n$, respectively. Also, the overall intensity of the signal is denoted by $c_n$. Then, an evaluation value $E_n$ can be calculated in accordance with equation (1).

Then, the adjustment reference mark 14 is rotated by 180 deg. by means of the rotational shaft 24. Also, it is focus-moved by the piezoelectric device 22 again, and imagewise data is taken again. The measurement in this status is represented by the addition of a subscript "r", and the heights (levels) of edge signal components of the produced imagewise data are denoted by $a_r$ and $b_r$, respectively. Also, the overall intensity of the signal is denoted by $c_r$. Then, an evaluation value $E_r$ can be calculated in accordance with equation (1).

The thus obtained two evaluation values $E_n$ and $E_r$ are averaged:

$$E_0=(E_n+E_r)/2 \quad (2)$$

The resultant average evaluation value $E_0$ is taken as a final evaluation value. If the evaluation value $E_0$ is smaller than a predetermined discrimination reference $E_{th}$, it is concluded that adjustment of the detection optical system is sufficient and that ordinary alignment routine should be continued. The discrimination reference $E_{th}$ may be preset in relation to each position detecting system, as a discrimination threshold value with which the inter-process offset to be produced comes into a tolerable range. If the evaluation value $E_0$ does not satisfy the condition (2), information related to the evaluation value $E_0$ is displayed at display means such as a CRT, for example. In that occasion, since the adjustment of the detection optical system is insufficient, changing the optical gravity center position of the effective light source and calculation of the final evaluation value $E_0$ are repeated until the evaluation value $E_0$ becomes less than the discrimination reference $E_{th}$.

By using an image of the reference mark 14 not rotated and an image of the same as rotated by 180 deg., the effect of offset resulting from the asymmetry of the reference mark 14 used can be avoided, and adjustment of the detection optical system is then performed. Thus, if it is known beforehand that the step structure of the reference mark 14 is fully symmetric with respect to the mark center 34, the procedure of 180 deg. rotation and measurement may be omitted. Also, if the amount of offset to be produced as a result of 180 deg. rotation is known beforehand, the procedure of rotation may be omitted and, in place thereof, that offset amount may be reflected to the evaluation value $E_n$ to determine the final evaluation value $E_0$.

While the foregoing description has been made with reference to adjustment in one direction, that is, to adjustment for measurement in the Y direction, final alignment should be made two-dimensionally. To this end, adjustment in the X direction perpendicular to the Y direction, i.e., in X direction in FIG. 1, may be made in a similar way. More specifically, as regards the X direction, the adjustment reference mark 14 may be rotated by 90 deg. and 270 deg., respectively, and measurements may be made in two different status with a difference of 180 deg., in a similar manner as the Y direction measurement. In this manner, the adjustment in both of the X and Y directions may be done by using a single adjustment mark 14. Use of one and the same mark is effective not only for space saving but also for ease of offset control because the mark itself is common for two directions. This provides a large practical advantage.

Figure 2:
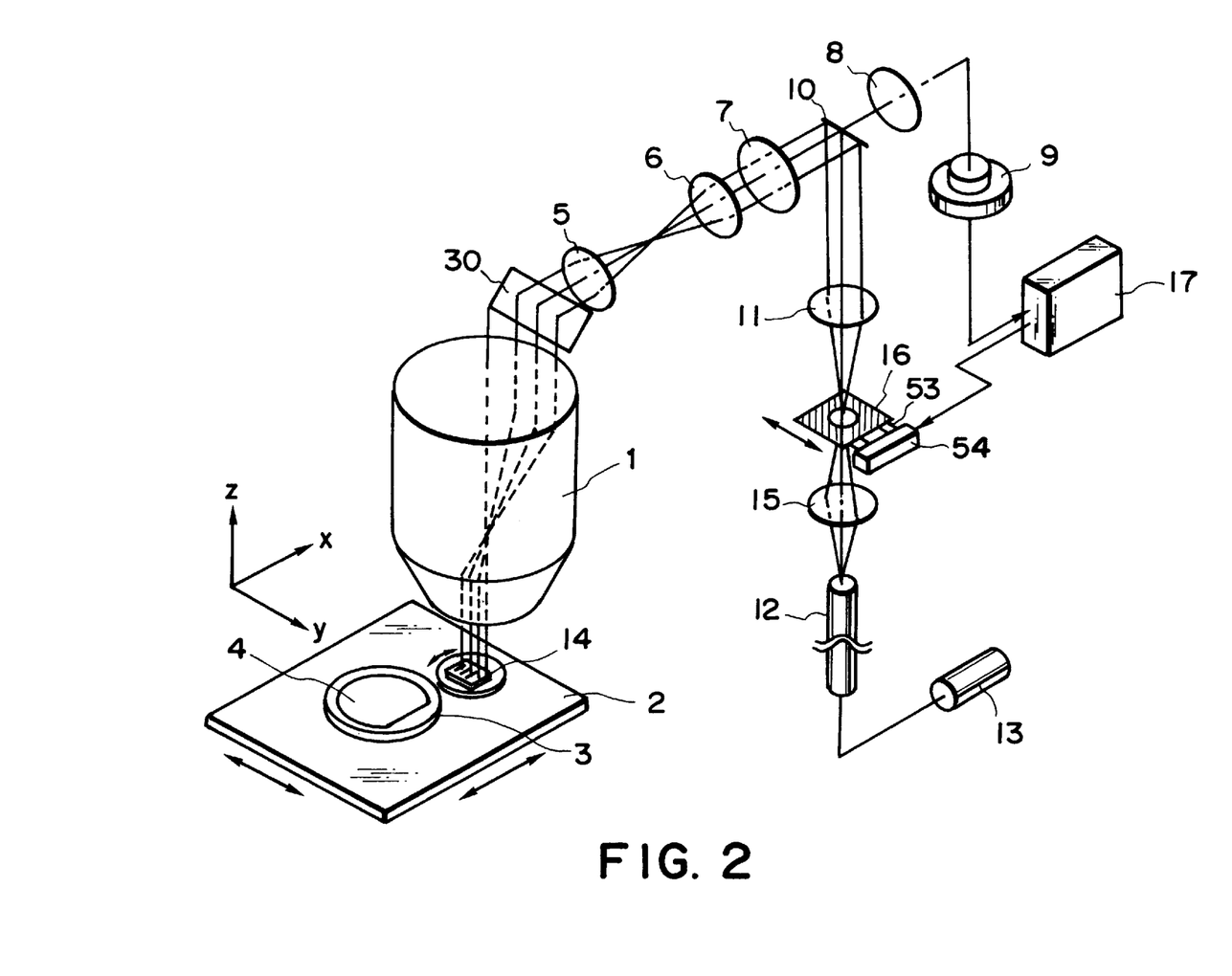
FIG. 2 is a schematic view of a position detecting system according to a second embodiment of the present invention.

FIG. 2 is a schematic view of a main portion of a second embodiment of the present invention. In this embodiment, the position detecting system of a projection exposure apparatus for manufacture of semiconductor devices is provided with a correction system for automatically performing optimization of an optical gravity center of an effective light source. Reference numerals the same as those of the preceding embodiment are assigned to corresponding elements. An important distinction of this embodiment resides in the structure of illumination means of the position detecting optical system. Since the remaining portion has substantially the same structure as FIG. 1, the following description will be made mainly on the illumination means.

Light from the light source 13 and emitted out of the fiber 12 passes an illumination system lens 15. After this, an image of the end face of the fiber (i.e., effective light source) is imaged at least once within the illumination system 11. At the imaging position, an aperture 16 effective to define σ of the detection system not greater than 1 (or a spatial frequency filter equivalent to that aperture) is disposed. The illumination system lens 15 serves to image the fiber end face at the position of the aperture 16 and to a size sufficiently larger than that of the aperture. Therefore, by displacing the position of the aperture 16 in a direction perpendicular to the optical axis of the illumination system, the optical gravity center of the effective light source can be adjusted and, thus, an optimum position detecting system is accomplished.

Movement of the aperture 16 is executed on the basis of calculation of an optimum movement amount therefor through calculation processing means 17 and in accordance with an evaluation value $E_0$, as has been explained with reference to the first embodiment. In accordance with the result of calculation, driving means 53 comprising a piezoelectric device, for example, is used to move the aperture 16. Automatic and easy high-precision adjustment of position detecting optical system is thus accomplished.

The automatic correction sequence as described may desirably be performed at periodic maintenance or in an occasion where any disorder occurs in the apparatus. If the measured value of evaluation value $E_0$ is larger than a discrimination reference $E_{th}$, a closed loop sequence which comprises displacing the optical gravity center position of the effective light source, calculating the evaluation value $E_0$ and comparing it with the discrimination reference, starts. If the evaluation value is not greater than the reference, ordinary alignment routine starts as described.

Figure 8:
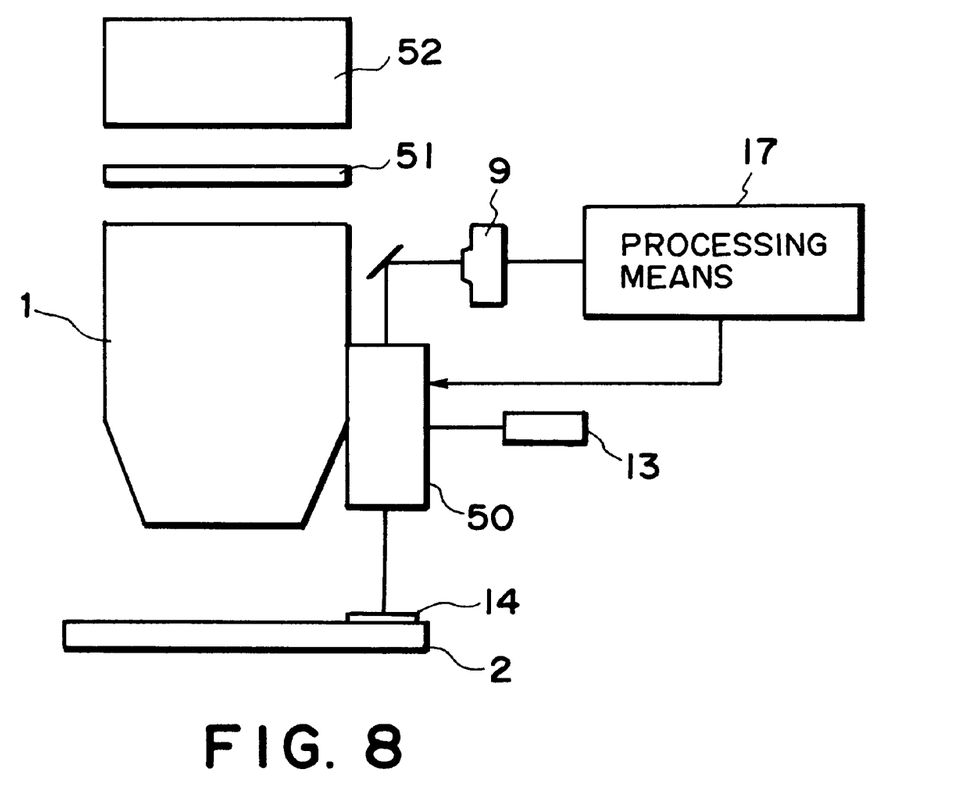
FIG. 8 is schematic view of a position detecting system according to a third embodiment of the present invention.

FIG. 8 is a schematic view of a main portion of a third embodiment of the present invention. In the foregoing embodiments, description has been made with respect to a position detecting optical system of what can be called a TTL off-axis type wherein position detection is made through a projection exposure optical system. The embodiment of FIG. 8 is an example wherein the invention is applied to a position detecting optical system of simple off-axis type without using a projection exposure optical system. In the drawing, reference numerals the same as those of the foregoing embodiments are assigned to corresponding elements.

Light from a light source 13 is directed to a position detecting optical system 50 and it illuminates a wafer or a reference mark 14 for adjustment. The adjustment reference mark 14 is mounted on a stage 2, and it has a structure such as shown in FIG. 9, as in the preceding embodiments. Reflection light from the reference mark 14 is imaged on a photoelectric converting element 9 such as a CCD camera, for example, and it is converted into an electric signal. On the basis of information obtainable from that signal, calculating and processing means 17 calculates an evaluation value $E_0$ and compares it with a discrimination reference $E_{th}$. The procedure following it for determining whether the optical gravity position of the effective light source of the illumination system should be adjusted or not, is essentially the same as the first and second embodiments.

As for a position detecting system of what can be called a TTR on-axis type wherein a mark on a wafer is observed through a reticle 51, checking the state of adjustment of the detection optical system and enhancement of position detecting precision can be accomplished by the provision of a similar function and a similar arrangement as of any of the first to third embodiments.

While the invention has been described with reference to the structures disclosed herein, it is not confined to the details set forth and this application is intended to cover such modifications or changes as may come within the purposes of the improvements or the scope of the following claims.

What is claimed is:

1. A position detecting method, comprising the steps of:
    illuminating a mark having a step, by use of illuminating means;
    imaging, by use of a position detecting optical system, the mark on a photoelectric converting element;
    calculating an evaluation value which represents the symmetry of an intensity of a signal produced through photoelectric conversion of the mark image by the photoelectric converting element;
    adjusting the position of an effective light source of the illumination means with respect to an optical axis of the position detecting optical system on the basis of the evaluation value, wherein, with the position adjustment, an incidence angle characteristic of illumination light from the illumination means upon the surface to be detected is adjusted.

2. A method according to claim 1, wherein said calculating step includes calculating an evaluation value on the basis of a difference in light intensity between edges of the mark image on the opposite sides of a center of the mark.

3. A method according to claim 1, wherein, when a detection wavelength used with the position detecting optical system is $\lambda$, the step of the mark has a magnitude corresponding to a product of $\lambda/8$ multiplied by an odd number.

4. A method according to claim 1, wherein the position adjustment is performed to correct an error involved in the position detecting optical system.

5. A position detecting system, comprising:

illuminating means for illuminating a mark having a step;

a position detecting optical system for imaging the mark on a photoelectric converting element;

control means for calculating an evaluation value which represents the symmetry of an intensity of a signal produced through photoelectric conversion of the mark image by the photoelectric converting element, and for adjusting the position of an effective light source of the illumination means with respect to an optical axis of the position detecting optical system on the basis of the evaluation value, wherein, with the position adjustment, an incidence angle characteristic of illumination light from the illumination means upon the surface to be detected is adjusted.

6. A system according to claim 5, wherein said control means calculates an evaluation value on the basis of a difference in light intensity between edges of the mark image on the opposite sides of a center of the mark.

7. A system according to claim 5, wherein, when a detection wavelength used with said position detecting optical system is $\lambda$, the step of the mark has a magnitude corresponding to $\lambda/8$.

8. A method according to claim 1, wherein said adjusting step comprises executing again said illumination step, said detecting step and said calculating step, after the mark is rotated by 180 degrees, and wherein the position of the effective light source with respect to the optical axis of the position detecting optical system is adjusted on the basis of two evaluation values representing the symmetry of the mark image, obtained before and after the 180 degree rotation.

9. A method according to claim 8, wherein, in said adjusting step, a difference between the two evaluation values is detected, and the adjustment of the position of the effective light source with respect to the optical axis of the position detecting optical system is performed until the difference comes into a predetermined range.

10. A method according to claim 8, wherein, when a detection wavelength of the position detecting optical system is $\lambda$, the mark has a level difference corresponding to a product of $\lambda/8$ and an odd number.

11. An apparatus according to claim 5, wherein said control means calculates evaluation values representing the symmetry of the mark image, before and after rotating the mark by 180 degrees, and adjusts the position of the effective light source with respect to the optical axis of said position detecting optical system on the basis of the two evaluation values.

12. An apparatus according to claim 11, wherein said control means further detects a difference between the two evaluation values and adjusts the position of the effective light source with respect to the optical axis of said position detecting optical system until the difference comes into a predetermined range.

13. An apparatus according to claim 11, wherein when a detection wavelength of said position detecting optical system is $\lambda$, the mark has a level difference corresponding to a product of $\lambda/8$ and an odd number.

* * * * *

UNITED STATES PATENT AND TRADEMARK OFFICE
CERTIFICATE OF CORRECTION

PATENT NO. : 5,943,135

DATED : August 24, 1999

INVENTOR : KAZUHIKO MISHIMA

Page 1 of 2

It is certified that error appears in the above-identified patent and that said Letters Patent is hereby corrected as shown below:

ON THE COVER PAGE:

At item No. [30], "Foreign Application Priority Data", "Oct. 13, 1996" should read --Oct. 13, 1995--.

IN THE DISCLOSURE:

COLUMN 1:
Line 63, "on" should be deleted; and
Line 64, "to" should read --onto--.

COLUMN 2:
Line 50, "fore" should read --fore,--.

COLUMN 3:
Line 27, "comlicated" should read --complicated--.

COLUMN 6:
Line 3, "is schematic" should read --is a schematic--; and
Line 5, "FIG. 9" should read --¶ FIG. 9--.

UNITED STATES PATENT AND TRADEMARK OFFICE
CERTIFICATE OF CORRECTION

PATENT NO. : 5,943,135

DATED      : August 24, 1999

INVENTOR   : KAZUHIKO MISHIMA

It is certified that error appears in the above-identified patent and that said Letters Patent is hereby corrected as shown below:

COLUMN 9:
Line 22, "status" should read --statuses--.

COLUMN 10:
Line 39, "as of" should read --as that of--.

Signed and Sealed this

Thirteenth Day of June, 2000

Attest:

Q. TODD DICKINSON

Attesting Officer         Director of Patents and Trademarks